United States Patent
Kim

(10) Patent No.: US 12,412,849 B2
(45) Date of Patent: Sep. 9, 2025

(54) SEMICONDUCTOR PACKAGE AND MEMORY DEVICE INCLUDING THE SAME

(71) Applicant: SAMSUNG ELECTRONICS CO., LTD., Suwon-si (KR)

(72) Inventor: Hyunjin Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 501 days.

(21) Appl. No.: 17/899,715

(22) Filed: Aug. 31, 2022

(65) Prior Publication Data

US 2023/0076865 A1  Mar. 9, 2023

(30) Foreign Application Priority Data

Sep. 3, 2021 (KR) .................. 10-2021-0117946

(51) Int. Cl.
  *H01L 23/00* (2006.01)
  *G11C 16/22* (2006.01)
  *H01L 25/065* (2023.01)

(52) U.S. Cl.
  CPC ........... *H01L 23/573* (2013.01); *G11C 16/22* (2013.01); *H01L 24/48* (2013.01); *H01L 25/0657* (2013.01); *H01L 2224/48147* (2013.01); *H01L 2224/48265* (2013.01); *H01L 2225/06506* (2013.01); *H01L 2225/0652* (2013.01); *H01L 2225/06562* (2013.01); *H01L 2924/1438* (2013.01)

(58) Field of Classification Search
  CPC ............................... H01L 23/573; H01L 23/57
  See application file for complete search history.

(56) References Cited

U.S. PATENT DOCUMENTS

| | | |
|---|---|---|
| 8,963,713 B2 | 2/2015 | Dawes et al. |
| 9,071,446 B2 | 6/2015 | Kreft |
| 2006/0068635 A1 | 3/2006 | Lemke et al. |
| 2009/0146267 A1 | 6/2009 | Peytavy et al. |
| 2010/0155885 A1 | 6/2010 | Pharn et al. |
| 2011/0080715 A1 | 4/2011 | Chiao-Li |
| 2013/0036314 A1 | 2/2013 | Glew et al. |
| 2018/0114761 A1* | 4/2018 | Chua ................ H10F 77/953 |
| 2020/0232611 A1* | 7/2020 | Raring .............. H01S 5/0233 |

\* cited by examiner

*Primary Examiner* — Yu-Hsi D Sun
(74) *Attorney, Agent, or Firm* — Morgan, Lewis & Bockius LLP

(57) ABSTRACT

A semiconductor package includes: a package board including a plurality of connection pads; a semiconductor chip including a first surface and a plurality of bonding pads, wherein the first surface of the semiconductor chip contacts a first surface of the package board, and wherein the plurality of bonding pads are respectively connected to the plurality of connection pads; and a thermal fuse circuit connected between a sensing connection pad of the plurality of connection pads and a sensing bonding pad of the plurality of bonding pads, and configured to open between the sensing connection pad and the sensing bonding pad when an internal temperature of the thermal fuse circuit is greater than or equal to a cutoff temperature of the thermal fuse circuit.

20 Claims, 10 Drawing Sheets

SEMICONDUCTOR PACKAGE AND MEMORY DEVICE INCLUDING THE SAME

CROSS-REFERENCE TO RELATED APPLICATION

This application claims priority under 35 U.S.C. § 119 to Korean Patent Application No. 10-2021-0117946, filed on Sep. 3, 2021, in the Korean Intellectual Property Office, the disclosure of which is incorporated by reference herein in its entirety.

TECHNICAL FIELD

The present inventive concept relates to a semiconductor package and a memory device including the same, and more particularly, to a semiconductor package including a thermal fuse circuit, and a memory device including the semiconductor package.

DISCUSSION OF THE RELATED ART

Generally, a semiconductor package including one or more semiconductor chips may be connected to a circuit board to form a memory device. The semiconductor package may be connected to the circuit board through pins or legs that are exposed to the outside of the semiconductor package, or may be connected to the circuit board through a plurality of solder balls formed on one surface of the semiconductor package.

After the semiconductor package is connected to the circuit board through the plurality of solder balls, the plurality of solder balls and the circuit board may be separated from each other by applying to the memory device to melt the plurality of solder balls. Thus, a person (e.g., an unauthorized) who wants to access to data stored in the semiconductor package without permission may gain access to the data stored in the semiconductor package by separating the semiconductor package from the circuit board by heating the semiconductor package and by connecting the semiconductor package to another device.

SUMMARY

According to an example embodiment of the present inventive concept, a semiconductor package includes: a package board including a plurality of connection pads; a semiconductor chip including a first surface and a plurality of bonding pads, wherein the first surface of the semiconductor chip contacts a first surface of the package board, and wherein the plurality of bonding pads are respectively connected to the plurality of connection pads; and a thermal fuse circuit connected between a sensing connection pad of the plurality of connection pads and a sensing bonding pad of the plurality of bonding pads, and configured to open between the sensing connection pad and the sensing bonding pad when an internal temperature of the thermal fuse circuit is greater than or equal to a cutoff temperature of the thermal fuse circuit.

According to an example embodiment of the present inventive concept, a semiconductor package includes: a package board including a plurality of connection pads; a first semiconductor chip including a first surface and a plurality of first bonding pads, wherein the first surface of the first semiconductor chip is in contact with a first surface of the package board; a second semiconductor chip including a first surface and a plurality of second bonding pads, wherein the first surface of the second semiconductor chip is in contact with a second surface of the first semiconductor chip, and wherein the plurality of second bonding pads are connected to the plurality of connection pads and the plurality of first bonding pads; and a thermal fuse circuit connected between a sensing connection pad of the plurality of connection pads and a second sensing bonding pad of the plurality of second bonding pads, and configured to open between the sensing connection pad and the second sensing bonding pad when an internal temperature of the thermal fuse circuit is greater than or equal to a cutoff temperature of the thermal fuse circuit.

According to an example embodiment of the present inventive concept, a memory device includes: a circuit board including a plurality of connection pins; a package board including a plurality of connection pads to be connected to the plurality of connection pins through a plurality of solder balls; a semiconductor chip including a first surface and a plurality of bonding pads, wherein the first surface of the semiconductor chip is in contact with a first surface of the package board, and wherein the plurality of bonding pads are connected to the plurality of connection pads; and a thermal fuse circuit connected to a sensing connection pad of the plurality of connection pads and a sensing bonding pad of the plurality of bonding pads, and configured to open between the sensing connection pad and the sensing bonding pad when an internal temperature of the thermal fuse circuit is greater than or equal to a cutoff temperature of the thermal fuse circuit.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, example embodiments of the present inventive concept will be described in detail with reference to the accompanying drawings.

Figure 1:
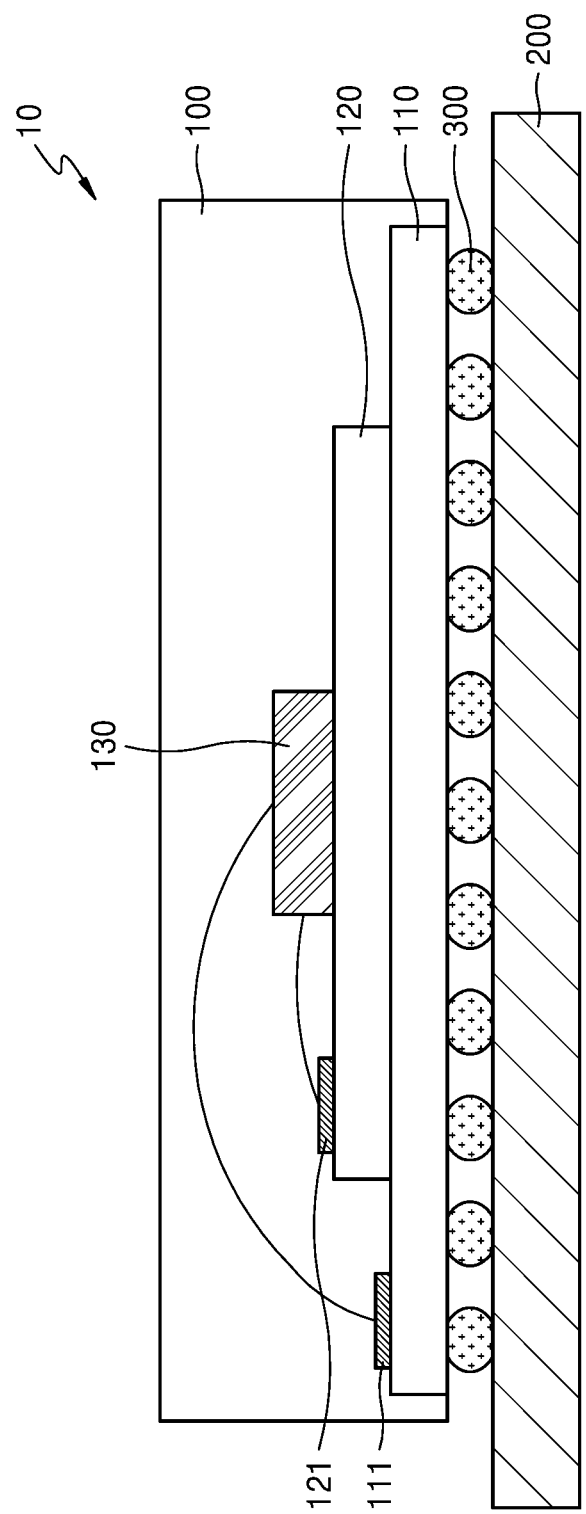
FIG. 1 is a view illustrating a memory device including a semiconductor package according to an example embodiment of the present inventive concept.

FIG. 1 is a view illustrating a memory device including a semiconductor package according to an example embodiment of the present inventive concept. For example, FIG. 1 may illustrate a cross-sectional view of a semiconductor package 100 and a circuit board 200.

Referring to FIG. 1, a memory device 10 according to an example embodiment of the present inventive concept may include the semiconductor package 100 and the circuit board 200. The semiconductor package 100 and the circuit board 200 may be connected to each other through a plurality of solder balls 300.

The semiconductor package 100 may include a package board 110, a semiconductor chip 120, and a thermal fuse circuit 130. A region in the semiconductor package 100 in which the package board 110, the semiconductor chip 120 and the thermal fuse circuit 130 are not present, may be filled with, for example, a molding member.

The package board 110 may include a plurality of connection pads. For example, the plurality of connection pads may be formed on the package board 110, and the package board 110 may be connected to another substrate or chip through the plurality of connection pads.

In an example embodiment of the present inventive concept, the package board 110 may be one of a printed circuit board (PCB), a flexible substrate, or a tape substrate.

The semiconductor chip 120 may store data. In an example embodiment of the present inventive concept, the semiconductor chip 120 may be non-volatile storage device. One surface of the semiconductor chip 120 may be in contact with one surface of the package board 110. The semiconductor chip 120 may include a plurality of bonding pads. For example, the plurality of bonding pads may be formed in the semiconductor chip 120, and the semiconductor chip 120 may be connected to the package board 110 or another chip through the plurality of bonding pads.

The semiconductor chip 120 may be connected to the package board 110. In this case, the semiconductor chip 120 may be connected to a plurality of connection pads formed in the package board 110 through the plurality of bonding pads of the semiconductor chip 120. In an example embodiment of the present inventive concept, each of the plurality of connection pads of the package board 110 may be respectively connected to the plurality of bonding pads of the semiconductor chip 120 through a corresponding wire.

The thermal fuse circuit 130 may be connected between a sensing connection pad 111 of the plurality of connection pads and a sensing bonding pad 121 of the plurality of bonding pads. When the internal temperature of the thermal fuse circuit 130 is greater than or equal to a cutoff temperature, the thermal fuse circuit 130 may be open between the sensing connection pad 111 and the sensing bonding pad 121. For example, when the internal temperature of the thermal fuse circuit 130 is greater than or equal to the cutoff temperature, the thermal fuse circuit 130 may cutoff the connection between the package board 110 and the semiconductor chip 120.

For example, the thermal fuse circuit 130 may be disposed on an upper surface of the semiconductor chip 120. However, the present inventive concept is not limited thereto. For example, the thermal fuse circuit 130 may be arranged on another surface of the semiconductor chip 120. For example, one surface of the thermal fuse circuit 130 may be in contact with another surface of the semiconductor chip 120.

In this case, the thermal fuse circuit 130 may be arranged on another surface of the semiconductor chip 120 to be located in the central region of the package board 110 on a plan view on the x-y-plane. In an example embodiment of the present inventive concept, the central region may be set to a rectangular region centering on the center of the package board 110 on the x-y plane. This will be described in more detail with reference to FIG. 2.

Figure 2:
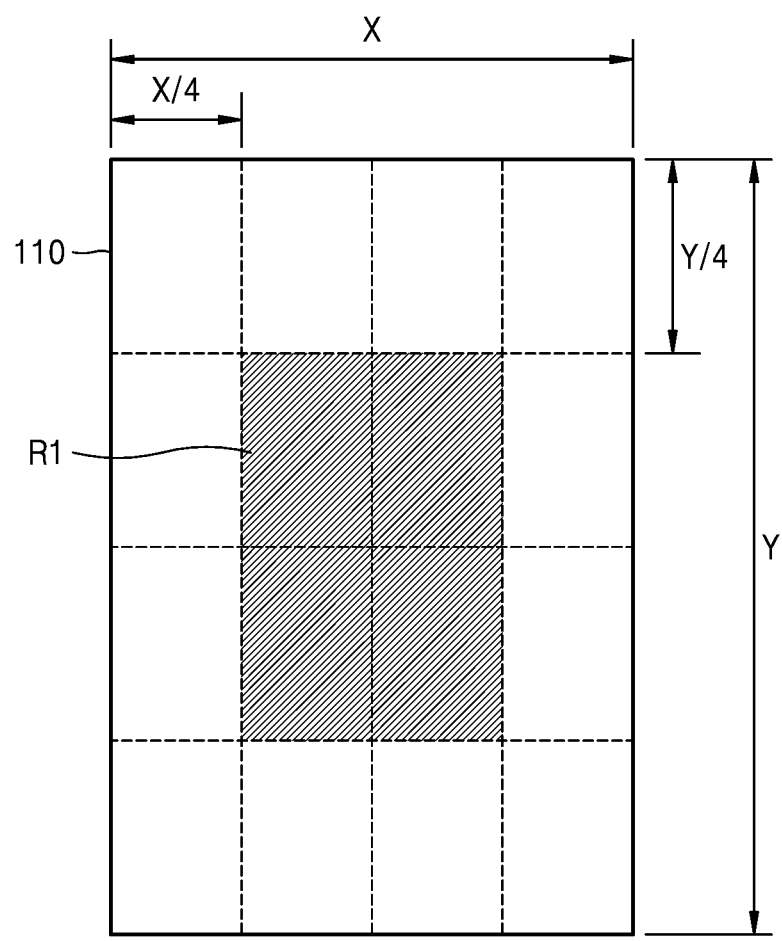
FIG. 2 is a view illustrating the position of a thermal fuse circuit in a semiconductor package according to an example embodiment of the present inventive concept.

FIG. 2 is a view illustrating the position of a thermal fuse circuit in a semiconductor package according to an example embodiment of the present inventive concept.

Referring to FIG. 2, an example of the package board 110 viewed from the top is illustrated. Hereinafter, when one component is located in a +z-axis direction of another component, the one component may be understood to be located on or above another component in a vertical direction, and when one component is located in a −z-axis direction of another component, one component may be understood to be located under another component in the vertical direction.

In an example embodiment of the present inventive concept, the package board 110 may have a shape of a rectangle having a horizontal length of X and a vertical length of Y, as shown in FIG. 2.

The width and length of a region on the package board 110 may be divided into quarters so that the region on the package board 110 may be divided into a total of 16 rectangular regions having a horizontal length of X/4 and a vertical length of Y/4. In this case, four regions in the middle of the divided regions may be set to a central region R1 of the package board 110. The thermal fuse circuit 130 may be arranged in the central region R1 of the package board 110.

Referring back to FIG. 1, in an example embodiment of the present inventive concept, the central region R1 may be set to a circular region centering on the center of the package board 110 on the x-y plane. However, the present inventive concept is not limited thereto. In an example embodiment of the present inventive concept, the central region R1 of the package board 110 may be set by using other methods.

When the semiconductor package 100 is separated from the circuit board 200 by melting a plurality of solder balls 300 to access to data stored in the semiconductor package 100 without permission, heating may be performed centering on the center of the semiconductor package 100. Thus, as described above, the thermal fuse circuit 130 may be located in the central region R1 of the package board 110 so that, when the semiconductor package 100 is heated, the thermal fuse circuit 130 may cutoff the connection between the package board 110 and the semiconductor chip 120 more securely.

The circuit board 200 may be connected with the package board 110. For example, the circuit board 200 may be in contact with another surface of the package board 110. For example, the package board 110 may be mounted on the circuit board 200 so that another surface of the package board 110 may be in contact with one surface of the circuit board 200.

In summary, one surface of the circuit board 200 may be connected with another surface of the package board 110, and one surface of the package board 110 may be connected with one surface of the semiconductor chip 120, and another surface of the semiconductor chip 120 may be connected with one surface of the thermal fuse circuit 130. For example, in the memory device 10, of the semiconductor chip 120, package board 110, and the solder balls 300, the thermal fuse circuit 130 may be arranged to be farthest from the circuit board 200.

The circuit board 200 may include a plurality of connection pins. For example, the plurality of connection pins may be formed in the circuit board 200, and the circuit board 200 may be connected to another substrate or chip through the plurality of connection pins.

In an example embodiment of the present inventive concept, the circuit board 200 may be one of a printed circuit board (PCB), a flexible substrate, or a tape substrate.

The circuit board 200 may be connected to the semiconductor package 100 through the plurality of solder balls 300. For example, the plurality of connection pins of the circuit board 200 may be connected to the plurality of connection pins of the package board 110 through the plurality of solder balls 300. For example, the plurality of solder balls 300 may be replaced with ball grid arrays (BGAs) or lead frames.

Figure 3:
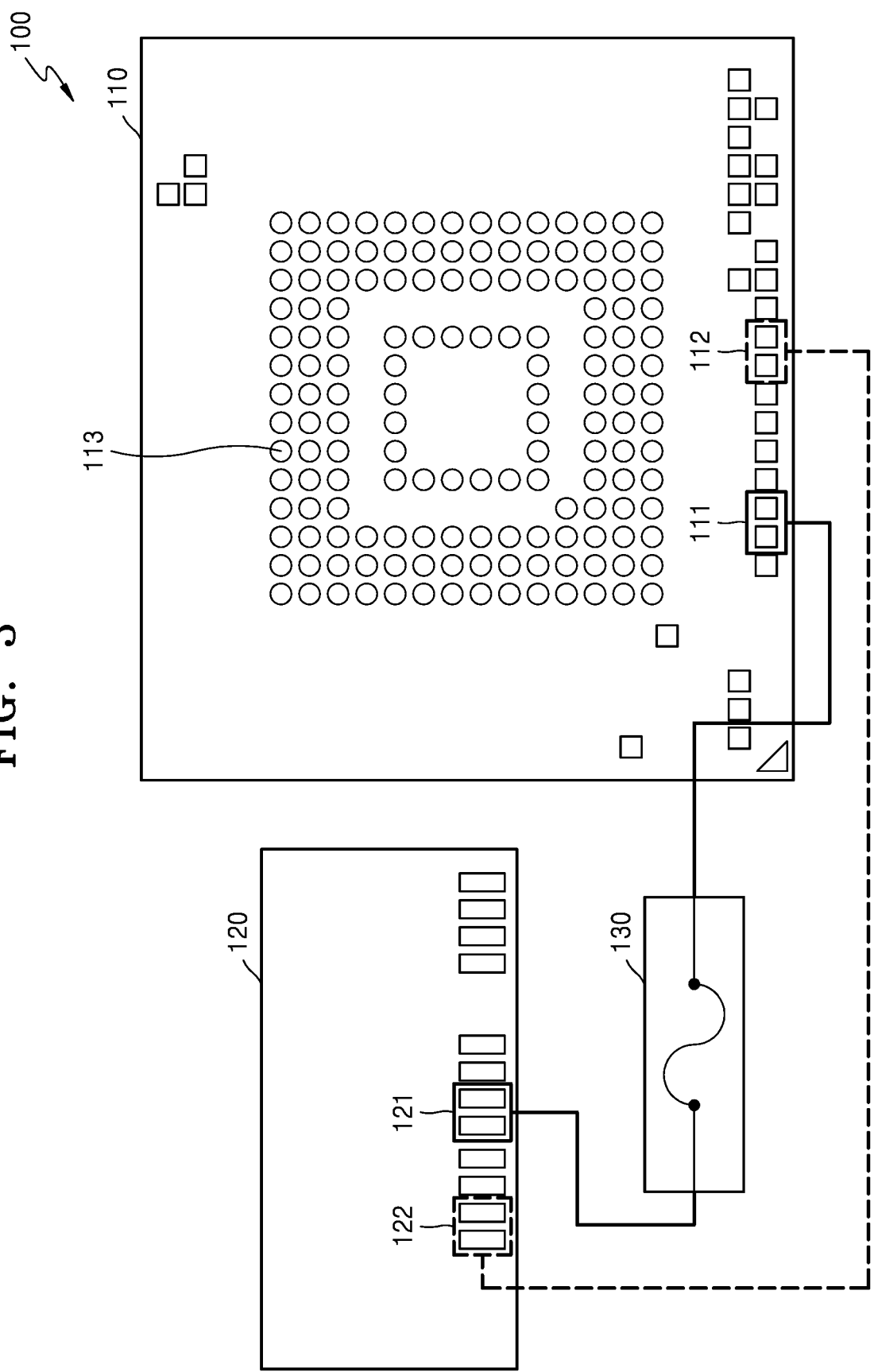
FIG. 3 is a circuit diagram illustrating a semiconductor package according to an example embodiment of the present inventive concept.

FIG. 3 is a circuit diagram illustrating a semiconductor package according to an example embodiment of the present inventive concept.

Referring to FIG. 3, the semiconductor package 100 according to an example embodiment of the present inventive concept may include a package board 110, a semiconductor chip 120, and a thermal fuse circuit 130.

The package board 110 may include a plurality of connection pads 111 and 112. The semiconductor chip 120 may include a plurality of bonding pads 121 and 122. Each of the plurality of connection pads 111 and 112 and the plurality of bonding pads 121 and 122 may be respectively connected to each other through a corresponding wire.

In this case, the thermal fuse circuit 130 may be connected between the sensing connection pad 111 of the plurality of connection pads 111 and 112 and the sensing bonding pad 121 of the plurality of bonding pads 121 and 122. The thermal fuse circuit 130 might not be connected between a connection pad 112 of the plurality of connection pads 111 and 112 and a bonding pad 122 of the plurality of bonding pads 121 and 122.

The plurality of connection pins included in the circuit board 200 may be connected to the plurality of connection pads 111 and 112 through the plurality of solder balls 300. In this case, the sensing connection pin of the plurality of connection pins may be connected to the sensing connection pad 111.

The sensing connection pad 111 may be one of the plurality of connection pads 111 and 112 to which a signal used in an internal operation of the semiconductor chip 120 is transmitted. The sensing bonding pad 121 may be one of the plurality of bonding pads 121 and 122 to which a signal used in the internal operation of the semiconductor chip 120 is transmitted. The sensing connection pin may be one of the plurality of connection pins to which a signal used in the internal operation of the semiconductor chip 120 is transmitted.

In an example embodiment of the present inventive concept, the internal operation may be a of transmitting data stored in the semiconductor chip 120 to an outside or external component or device. A signal used in the read operation may include, for example, a chip enable signal, a read enable signal, a data strobe signal, a data signal, and a power signal.

In this case, signals transmitted through the plurality of connection pads 111 and 112 and the plurality of bonding pads 121 and 122 will be described in more detail with reference to FIG. 4.

Figure 4:
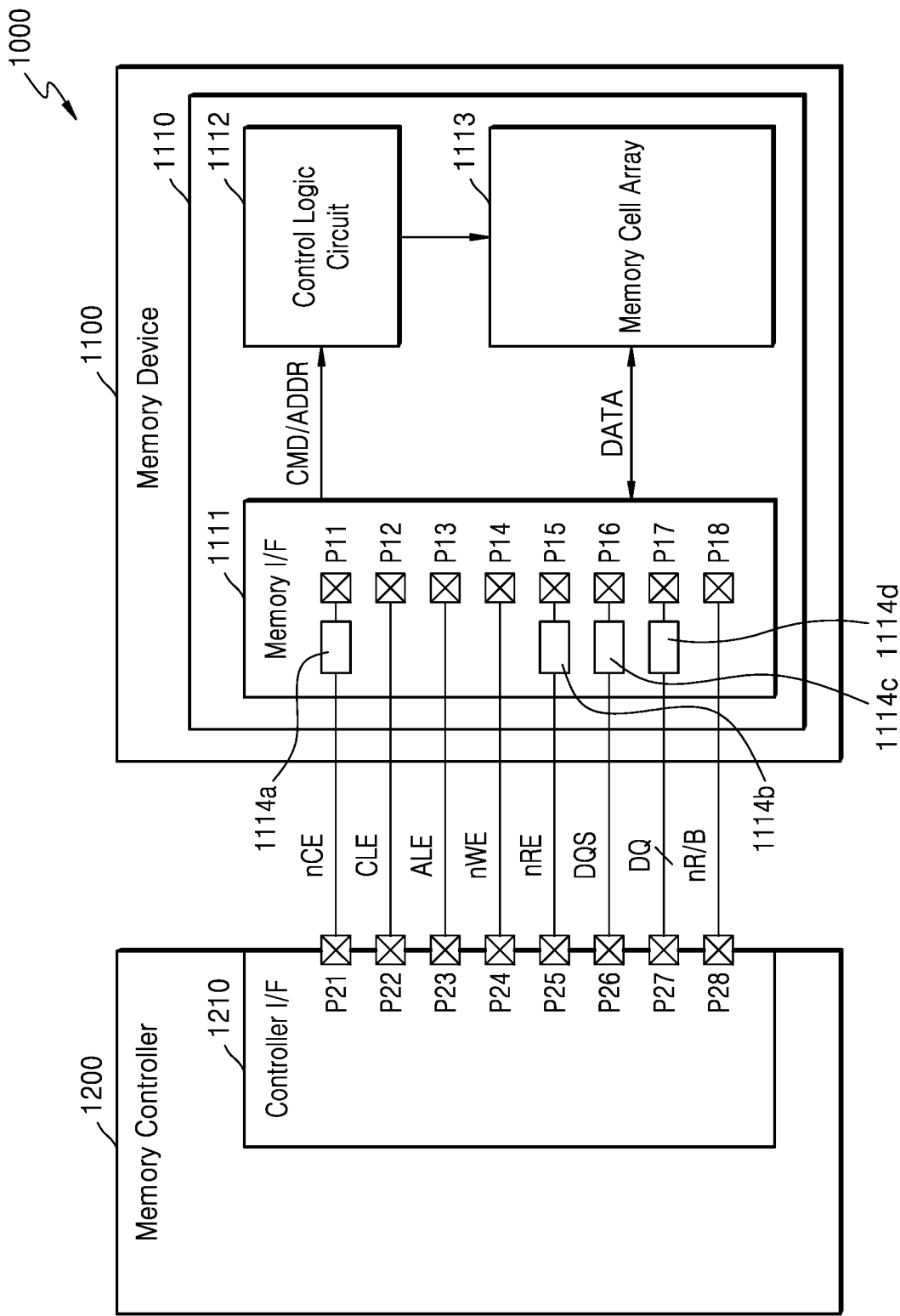
FIG. 4 is a view for describing signals transmitted through a plurality of bonding pads included in a memory device according to an example embodiment of the present inventive concept.

FIG. 4 is a view describing signals transmitted through a plurality of bonding pads included in a memory device according to an example embodiment of the present inventive concept.

Referring to FIG. 4, a memory system 1000 may include a memory device 1100 and a memory controller 1200. The memory device 1100 may correspond to the memory device 10 of FIG. 1.

The memory device 1100 may include a semiconductor chip 1110. The semiconductor chip 1110 may include a memory interface circuit 1111, a control logic circuit 1112, a memory cell array 1113, and thermal fuse circuits 1114*a*, 1114*b*, 1114*c*, and 1114*d*.

In this case, the memory device 1100 may further include a package board on which the semiconductor chip 1110 is mounted, and a circuit board on which the package board is mounted. The package board may be connected to the circuit board through the plurality of solder balls.

The memory interface circuit 1111 may include a plurality of bonding pads P11 through P18. The memory interface circuit 111 may receive a chip enable signal nCE from the memory controller 1200 through a first bonding pad P11. The memory interface circuit 1111 may transmit/receive signals to/from the memory controller 1200 through second through eighth bonding pads P12 through P18 according to the chip enable signal nCE. For example, when the chip enable signal nCE is in an enable state (e.g., at a high level), the memory interface circuit 1111 may transmit/receive signals to/from the memory controller 1200 through the second through eighth bonding pads P12 through P18.

The memory interface circuit 1111 may receive a command latch enable signal CLE, an address latch enable signal ALE, and a write enable signal nWE from the memory controller 1200 through the second through fourth bonding pads P12 through P14, respectively. The memory interface circuit 1111 may receive a data signal DQ from the memory controller 1200 through the seventh bonding pad P17 or transmit the data signal DQ to the memory controller 1200 through the seventh bonding pad P17. A command CMD, an address ADDR, and data DATA may be transmitted through the data signal DQ. For example, the data signal DQ may be transmitted through a plurality of data signal lines. In this case, the seventh bonding pad P17 may include a plurality of pads corresponding to a plurality of data signals.

The memory interface circuit 1111 may acquire the command CMD from the data signal DQ received in an enable period (e.g., in a high level state) of the command latch enable signal CLE based on toggle timings of a write enable signal nWE. The memory interface circuit 1111 may acquire the address ADDR from the data signal DQ received in an enable period (e.g., in a high level state) of the address latch enable signal ALE based on toggle timings of the write enable signal nWE.

In an example embodiment of the present inventive concept, the write enable signal nWE may be maintained in a static state (e.g., in a high level or low level state) and may toggle between a high level and a low level. For example, the write enable signal nWE may toggle in a period in which the command CMD or the address ADDR is transmitted. Thus, the memory interface circuit 1111 may acquire the command CMD or the address ADDR based on toggle timings of the write enable signal nWE.

The memory interface circuit 1111 may receive the read enable signal nRE from the memory controller 1200 through the fifth bonding pad P15. The memory interface circuit 1111 may receive a data strobe signal DQS from the memory controller 1200 through the sixth bonding pad P16 or transmit the data strobe signal DQS to the memory controller 1200.

In an operation of outputting the data DATA of the memory device 1100, the memory interface circuit 1111 may receive the write enable signal nRE that toggles through the fifth bonding pad P15 before outputting the data DATA. The memory interface circuit 1111 may generate a data strobe signal DQS that toggles based on toggling of the write enable signal nRE. For example, the memory interface circuit 1111 may generate the data strobe signal DQS that begins toggling after a preset delay (e.g., tDQSRE) based on a toggling start time of the write enable signal nRE. The memory interface circuit 1111 may transmit the data signal DQ including the data DATA based on a toggle timing of the data strobe signal DQS. Thus, the data DATA may be aligned with the toggle timing of the data strobe signal DQS and may be transmitted to the memory controller 1200.

In an operation of inputting the data DATA of the memory device 1100, when the data signal DQ including the data DATA is received from the memory controller 1200, the memory interface circuit 1111 may receive the data strobe signal DQS that toggles with the data DATA from the memory controller 1200. The memory interface circuit 1111 may acquire the data DATA from the data signal DQ based on the toggle timing of the data strobe signal DQS. For example, the memory interface circuit 1111 may acquire the data DATA by sampling the data signal DQ at a rising edge and a falling edge of the data strobe signal DQS.

The memory interface circuit 1111 may transmit a ready/busy output signal nR/B to the memory controller 1200 through the eighth bonding pad P18. The memory interface circuit 1111 may transmit a status information of the memory device 1100 to the memory controller 1200 through the ready/busy output signal nR/B. When the memory device 1100 is in a busy state (e.g., when internal operations of the memory device 1100 are performed), the memory interface circuit 1111 may transmit the read/busy output signal nR/B indicating a busy state to the memory controller 1200. When the memory device 1100 is in a busy state (e.g., when the internal operations of the memory device 1100 are being processed or are not performed or completed), the memory interface circuit 1111 may transmit the read/busy output signal nR/B indicating a ready state to the memory controller 1200. For example, while the memory device 1100 reads the data DATA from the memory cell array 1113 in response to a page read command, the memory interface circuit 1111 may transmit the ready/busy output signal nR/B indicating a busy state (e.g., a low level) to the memory controller 1200. For example, while the memory device 1100 programs the data DATA in the memory cell array 1113 in response to a program command, the memory interface circuit 1111 may transmit the ready/busy output signal nR/B indicating a busy state to the memory controller 1200.

The control logic circuit 1112 may generally control various operations of the memory device 1100. The control logic circuit 1112 may receive a command/address CMD/ADDR acquired from the memory interface circuit 1111. The control logic circuit 1112 may generate control signals for controlling other components of the memory device 1100 according to the received command/address CMD/ADDR. For example, the control logic circuit 1112 may program the data DATA in the memory cell array 1113 or generate various control signals for reading the data DATA from the memory cell array 1113.

For example, the memory cell array 1113 may store the data DATA acquired from the memory interface circuit 1111 according to control of the control logic circuit 1112. For example, the memory cell array 1113 may output the stored data DATA according to control of the control logic circuit 1112 to the memory interface circuit 1111.

The memory cell array 1113 may include a plurality of memory cells. For example, the plurality of memory cells may be flash memory cells. However, example embodiments of the present inventive concept are not limited thereto, and the memory cells may be Resistive Random Access Memory (RRAM) cells, Ferroelectric Random Access Memory (FRAM) cells, Phase Change Random Access Memory (PRAM) cells, Thyristor Random Access Memory (TRAM) cells, or Magnetic Random Access Memory (MRAM) cells. Hereinafter, example embodiments of the present inventive concept will be described based on an example embodiment in which memory cells are NAND flash memory cells.

The memory controller 1200 may include first through eighth pins P21 through P28 and a controller interface circuit 1210. The first through eighth pins P21 through P28 may respectively correspond to the first through eighth bonding pads P11 through P18 of the memory device 1100.

The controller interface circuit 1210 may transmit the chip enable signal nCE to the memory device 1100 through the first pin P21. The controller interface circuit 1210 may transmit/receive signals to/from the memory device 1100 selected by the chip enable signal nCE through the second through eighth pins P22 through P28.

The controller interface circuit 1210 may transmit the command latch enable signal CLE, the address latch enable signal ALE, and the write enable signal nWE to the memory device 1100 through the second through fourth pins P22 through P24, respectively. The controller interface circuit 1210 may transmit the data signal DQ to the memory device 1100 through the seventh pin P27 or receive the data signal DQ from the memory device 1100 through the seventh pin P27.

The controller interface circuit 1210 may transmit the data signal DQ including the command CMD or the address ADDR together with the write enable signal nWE that toggles to the memory device 1100. The controller interface circuit 1210 may transmit the data signal DQ, which includes the command CMD, to the memory device 1100 as the command latch enable signal CLE having an enable state, and may transmit the data signal DQ, which includes the address ADDR, to the memory device 1100 as the address latch enable signal ALE having an enable state.

The controller interface circuit 1210 may transmit the read enable signal nRE to the memory device 1100 through the fifth pin P25. The controller interface circuit 1210 may receive the data strobe signal DQS from the memory device 1100 through the sixth pin P26 or transmit the data strobe signal DQS to the memory device 1100 through the sixth pin P26.

In an operation of outputting the data DATA of the memory device 1100, the controller interface circuit 1210 may generate a read enable signal nRE that toggles, and the controller interface circuit 1210 may transmit the read enable signal nRE to the memory device 1100. For example, the controller interface circuit 1210 may generate a read enable signal nRE that is changed from a fixed state (e.g., a high level or a low level) to a toggle state before the data DATA is output. Thus, the data strobe signal DQS that toggles may be generated in the memory device 1100 based on the read enable signal nRE. The controller interface circuit 1210 may receive the data signal DQ including the data DATA together with the data strobe signal DQS that toggles from the memory device 1100. The controller interface circuit 1210 may acquire the data DATA from the data signal DQ based on a toggle timing of the data strobe signal DQS.

In an operation of inputting the data DATA of the memory device 1100, the controller interface circuit 1210 may generate a data strobe signal DQS that toggles. For example, the controller interface circuit 1210 may generate a data strobe signal DQS that is changed from a fixed state (e.g., a high level or a low level) to a toggle state before the data DATA is transmitted to the memory device 1100. The controller interface circuit 1210 may transmit the data signal DQ including the data DATA to the memory device 1100 based on toggle timings of the data strobe signal DQS.

The controller interface circuit 1210 may receive the ready/busy output signal nR/B from the memory device 1100 through the eighth pin P28. The controller interface circuit 1210 may determine status information of the memory device 1100 based on the ready/busy output signal nR/B.

When the memory device 1100 may perform a read operation of the data DATA stored in the memory cell array 1113, the chip enable signal nCE, the read enable signal nRE, the data strobe signal DQS, and the data signal DQ may be used. Thus, one of the first bonding pad P11, the fifth bonding pad P15, the sixth bonding pad P16, and the seventh bonding pad P17 that are bonding pads to which the chip enable signal nCE, the read enable signal nRE, the data strobe signal DQS and the data signal DQ that are used in the read operation of the semiconductor chip 120 are respectively transmitted, may be a sensing bonding pad. Thermal fuse circuits 1114a, 1114b, 1114c, and 1114d may be connected to the sensing bonding pad. In this case, in the drawings, the thermal fuse circuits 1114a, 1114b, 1114c, and 1114d are respectively connected to the first bonding pad P11, the fifth bonding pad P15, the sixth bonding pad P16, and the seventh bonding pad 17. However, the present inventive concept is not limited thereto. For example, the thermal fuse circuits 1114a, 1114b, 1114c, and 1114d may be connected to only one of the first bonding pad P11, the fifth bonding pad P15, the sixth bonding pad P16, or the seventh bonding pad P17.

The memory device 1100 may further include a package board, on which the semiconductor chip 1110 is mounted, and a circuit board, on which the package board is mounted. The package board may be connected to the circuit board through the plurality of solder balls. In this case, the plurality of bonding pads P11 through P18 of the semiconductor chip 1110 may be respectively connected to a plurality of pins P21 through P28 of the controller interface circuit through a plurality of connection pads included in the package board and a plurality of connection pins included in the circuit board. For example, the thermal fuse circuits 1114a, 1114b, 1114c, and 1114d may be connected between the plurality of bonding pads P11 through P18 and the plurality of connection pads.

Referring back to FIG. 3, as described with reference to FIG. 4, when a read operation is performed, a chip enable signal, a read enable signal, a data strobe signal, and a data signal may be used. Thus, one of connection pads to which at least one of the chip enable signal, the read enable signal, the data strobe signal or the data signal are transmitted, may be a sensing connection pad 111. One of bonding pads to which at least one of the chip enable signal, the read enable signal, the data strobe signal or the data signal are transmitted, may be a sensing bonding pad 121.

When the read operation is performed, power needs to be supplied to the semiconductor chip 120. Thus, a power signal used to supply power to the semiconductor chip 120 from the package board 110 may be a signal used in the read operation. Thus, a connection pad to which the power signal is transmitted, may be a sensing connection pad 111. A bonding pad to which the power signal is transmitted, may be a sensing bonding pad 121.

In an example embodiment of the present inventive concept, a connection pad to which the chip enable signal is transmitted, may be the sensing connection pad 11, and a bonding pad to which the chip enable signal is transmitted, may be the sensing bonding pad 121. This is because the chip enable signal is not sensitive to an operating speed, even if the thermal fuse circuit is connected between the connection pad and the bonding pad to which the chip enable signal is transmitted, and accordingly, substantial signal delay might not occur.

The thermal fuse circuit 130 may be connected between the sensing connection pad 111 and the sensing bonding pad 121. When the internal temperature is greater than or equal to the cutoff temperature, the thermal fuse circuit 130 may open between the sensing connection pad 111 and the sensing bonding pad 121.

The thermal fuse circuit 130 may include one or more thermal fuses. In this case, when the internal temperature is greater than or equal to the cutoff temperature, one or more thermal fuses are disconnected so that the thermal fuse circuit 130 may open between the sensing connection pad 111 and the sensing bonding pad 121.

Here, the internal temperature is a temperature in the thermal fuse circuit 130 and may rise as the thermal fuse circuit 130 is heated from the outside temperature. The cutoff temperature is a temperate at which the thermal fuse is disconnected. In this case, the cutoff temperature may have different values according to the characteristics of one or more thermal fuses included in the thermal fuse circuit 130.

The cutoff temperature may be set in consideration of a reflow process temperature. In an example embodiment of the present inventive concept, the cutoff temperature may be greater than temperature obtained by adding a first margin temperature to a reflow process temperature. For example, a thermal fuse having a cutoff temperature greater than the temperature obtained by adding the first margin temperature to the reflow process temperature may be used as one or more thermal fuses.

The reflow process temperature is temperate at which, when the semiconductor package 100 is connected to the circuit board 200 through the plurality of solder balls 300, the plurality of solder balls 300 may be molten. Such reflow process temperature may be set in consideration of a melting point of the plurality of solder balls 300. In an example embodiment of the present inventive concept, the reflow process temperature may be about 230° C. In this case, the cutoff temperature may be greater than a temperature obtained by adding the first margin temperature (e.g., about 20° C.) to the reflow process temperature. In this way, the cutoff temperature is greater than a temperature obtained from the first margin temperature being added to the reflow process temperature so that one or more thermal fuses may be prevented from being disconnected during the reflow process.

When the semiconductor package 100 is separated from the circuit board 200 by melting the plurality of solder balls 300 to access to data stored in the semiconductor package 100 without permission, the semiconductor package 100 arranged on the circuit board 200 may be directly heated. For example, the semiconductor package 100 may be heated in an upward direction with reference to FIG. 1. For example, the semiconductor package 100 may be heated from below. In this case, the semiconductor package 100 may be heated in a direction adjacent to the thermal fuse circuit 130 and in a direction distant from the plurality of solder balls 300. Thus, when the memory device 10 is heated to access data stored in the semiconductor package 100 without permission, the temperature of the thermal fuse circuit 130 may be greater than the temperature of the plurality of solder balls 300. Thus, even if the cutoff temperature is greater than the reflow process temperature by the first margin temperature, when the semiconductor package 100 is separated from the circuit board 200 without permission, unauthorized access to the data stored in the semiconductor package 100 may be prevented through the thermal fuse circuit 130.

If the semiconductor package 100 is separated from the circuit board 200 according to a user's desire, the user may apply heat to the semiconductor package 100 in a downward direction with reference to FIG. 1, and the temperature of the plurality of solder balls 300 is greater than the temperature of the thermal fuse circuit 130. Thus, the user may separate the semiconductor package 100 from the circuit board 200 without opening the thermal fuse circuit 130 of the semiconductor package 100.

The cutoff temperature may be less than a temperature that is obtained by adding a second margin temperature to the reflow process temperature. In this case, the second margin temperature may be greater than the first margin temperature. For example, a thermal fuse having a cutoff temperature lower than the temperature obtained by adding the second margin temperature (e.g., about 70° C.) to the reflow process temperature may be used as one or more thermal fuses.

If the cutoff temperature is greater than the temperature that is obtained by adding the second margin temperature to the reflow process temperature, even when the memory device 10 is heated to access the data stored in the semiconductor package 100 without permission, one or more thermal fuses might not be disconnected. Thus, the cutoff temperature may be greater than the temperature obtained by adding the first margin temperature to the reflow process temperature and may be less than the temperature obtained by adding the second margin temperature to the reflow process temperature so that unauthorized access to the data stored in the semiconductor package 100 may be effectively prevented through one or more thermal fuses.

In this case, the relationship between the reflow process temperature, the cutoff temperature, the first margin temperature and the second margin temperature will be described in more detail with reference to FIG. 5.

Figure 5:
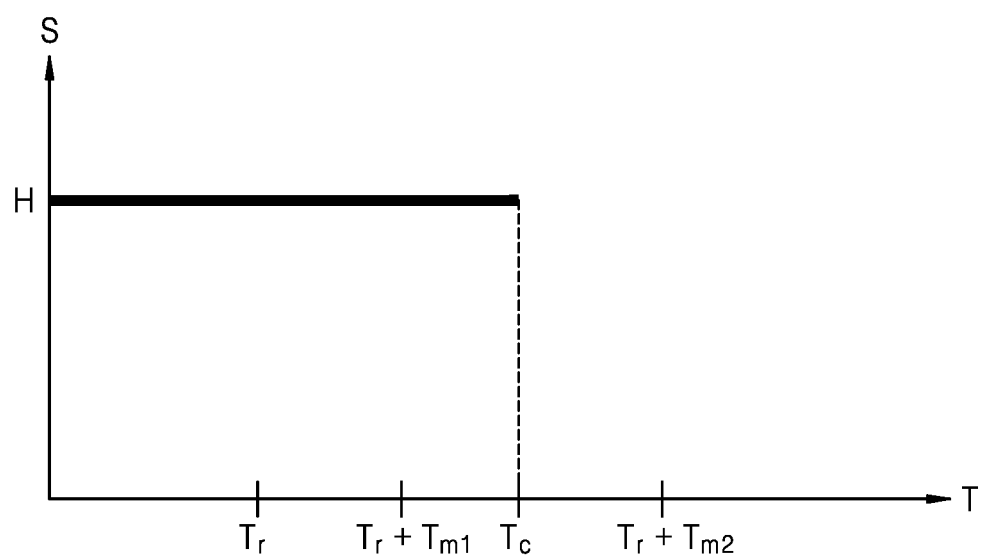
FIG. 5 is a graph for describing signal transmission according to a change in internal temperature of a thermal fuse circuit according to an example embodiment of the present inventive concept.

FIG. 5 is a graph describing signal transmission according to a change in internal temperature of a thermal fuse circuit according to an example embodiment of the present inventive concept.

Referring to FIG. 5, a graph showing signals transmitted between the sensing connection pad 111 and the sensing bonding pad 121 according to a change in internal temperature of the thermal fuse circuit 130 may be confirmed. In this case, high signals H (e.g., a high voltage signal or a high current signal) may be transmitted between the sensing connection pad 111 and the sensing bonding pad 121.

First, it may be confirmed that, when the internal temperature is less than a reflow process temperature $T_r$, the high signal H is transmitted. It may be confirmed that the internal temperature rises and is greater than a temperature obtained by adding a first margin temperature $T_{m1}$ to the reflow process temperature $T_r$ and is greater than or equal to a cutoff temperature $T_c$, the high signal H is not transmitted any more. For example, it may be confirmed that one or more thermal fuses are disconnected so that the sensing connection pad 111 and the sensing bonding pad 121 are opened and thus a signal is not transmitted any more. It may be confirmed even when the internal temperature rises continuously and is greater than the temperature obtained by adding the first margin temperature $T_{m2}$ to the reflow process temperature $T_r$, signals are not continuously transmitted.

Figure 6:
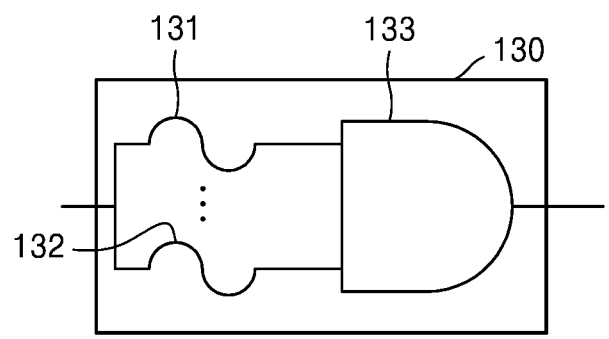
FIG. 6 is a circuit diagram illustrating a thermal fuse circuit according to an example embodiment of the present inventive concept.
Figure 7:
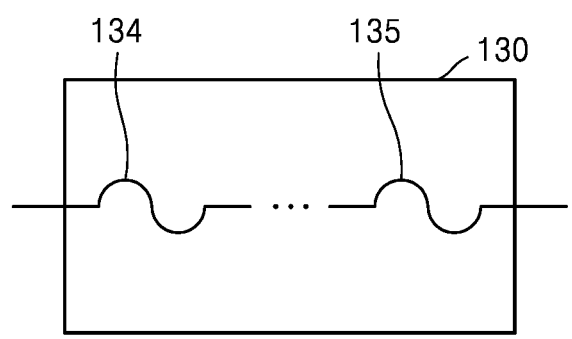
FIG. 7 is a circuit diagram illustrating a thermal fuse circuit according to an example embodiment of the present inventive concept.

Referring back to FIG. 3, the thermal fuse circuit 130 may be configured as a circuit including one or more thermal fuses. With reference to FIGS. 6 and 7, the thermal fuse circuit 130 according to an example embodiment of the present inventive concept will be described.

FIG. 6 is a circuit diagram illustrating a thermal fuse circuit according to an example embodiment of the present inventive concept.

Referring to FIG. 6, the thermal fuse circuit 130 according to an example embodiment of the present inventive concept may include a first thermal fuse 131, a second thermal fuse 132, and an AND gate 133.

One end (e.g., a first end) of the first thermal fuse 131 may be connected to the sensing connection pad 111. Another end (e.g., a second end) of the first thermal fuse 131 may be connected to a first input terminal of the AND gate 133.

One end (e.g., a first end) of the second thermal fuse 132 may be connected to the sensing connection pad 111. Another end (e.g., a second end) of the second thermal fuse 132 may be connected to a second input terminal of the AND gate 133.

The first input terminal of the AND gate 133 may be connected to the second end of the first thermal fuse 131, and the second input terminal of the AND gate 133 may be connected to the second end of the second thermal fuse 132. An output terminal of the AND gate 133 may be connected to the sensing bonding pad 121.

According to this connection, even when only one of the first thermal fuse 131 or the second thermal fuse 132 is disconnected, the AND gate 133 may transmit only a low signal through an output terminal so that signal transmission between the sensing connection pad 111 and the sensing bonding pad 121 may be disabled.

FIG. 7 is a circuit diagram illustrating a thermal fuse circuit according to an example embodiment of the present inventive concept.

Referring to FIG. 7, a thermal fuse circuit 130 according to an example embodiment of the present inventive concept may include a third thermal fuse 134 and a fourth thermal fuse 135.

One end (e.g., a first end) of the third thermal fuse 134 may be connected to the sensing connection pad 111. Another end (e.g., a second end) of the third thermal fuse 134 may be connected to the fourth thermal fuse 135.

One end (e.g., a first end) of the fourth thermal fuse 135 may be connected to the second end of the third thermal fuse 134. Another end (e.g., a second end) of the fourth thermal fuse 135 may be connected to the sensing bonding pad 121.

According to this connection, even when only one of the third thermal fuse 134 or the fourth thermal fuse 135 is disconnected, the sensing connection pad 111 and the sensing bonding pad 121 may be opened so that signal transmission between the sensing connection pad 111 and the sensing bonding pad 121 may be disabled.

Referring back to FIG. 3, the thermal fuse circuit 130 may include a plurality of thermal fuses, as shown in FIGS. 6 and 7. However, example embodiments of the present inventive concept are not limited thereto, and for example, the thermal fuse circuit 130 may include only one thermal fuse.

One or more thermal fuses included in the thermal fuse circuit 130 may be disconnected from the circuit when the internal temperature of the thermal fuse circuit 130 is greater than or equal to the cutoff temperature of the thermal fuse circuit 130. Thus, even if power is not supplied to the thermal fuse circuit 130, the thermal fuse circuit 130 may open between the sensing connection pad 111 and the sensing bonding pad 121. For example, the thermal fuse circuit 130 may open between the connection pad and the bonding pad regardless of the supply of power when the internal temperature of the thermal fuse circuit 130 is greater than or equal to the cutoff temperature. Thus, unauthorized access to data stored in the semiconductor package 100 may be prevented regardless of whether power is supplied to the semiconductor package 100.

Figure 8:
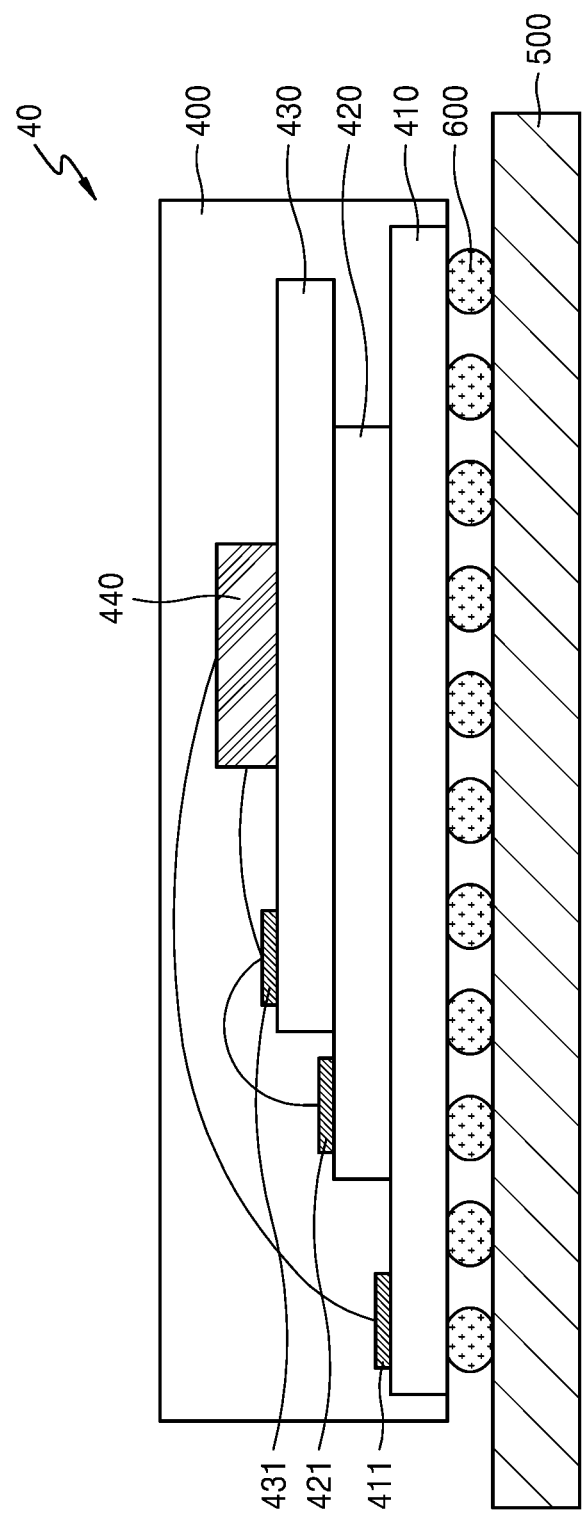
FIG. 8 is a view illustrating a memory device including a semiconductor package according to an example embodiment of the present inventive concept.

FIG. 8 is a view illustrating a memory device including a semiconductor package according to an example embodiment of the present inventive concept.

Referring to FIG. 8, a memory device 40 according to an example embodiment may include a semiconductor package 400 and a circuit board 500. The semiconductor package 400 and the circuit board 500 may be connected to each other through the plurality of solder balls 600.

The semiconductor package 400 may include a package board 410, a first semiconductor chip 420, a second semiconductor chip 430, and a thermal fuse circuit 440. A region of the semiconductor package 400 in which the package board 410, the first semiconductor chip 420, the second semiconductor chip 430 and the thermal fuse circuit 440 are not present, may be filled with, for example, a molding member.

In this case, the memory device 40 shown in FIG. 8 may include two semiconductor chips, unlike in the memory device 10 shown in FIG. 1. Hereinafter, the memory device 40 shown in FIG. 8 will be described based on differences between the memory device 10 of FIG. 1 and the memory device 40 of FIG. 8. In addition, to the extent that the description of various elements are omitted, it may be assumed that these elements are at least similar to corresponding elements that have already been described.

The package board 410 may include a plurality of connection pads.

One surface of the first semiconductor chip 420 may be in contact with one surface of the package board 410. The first semiconductor chip 420 may include a plurality of first bonding pads. For example, the plurality of first bonding pads may be formed in the first semiconductor chip 420, and the first semiconductor chip 420 may be connected to a substrate or chip through the plurality of first bonding pads. For example, the first semiconductor chip 420 may be electrically connected to the package board 410 through the plurality of first bonding pads. For example, the plurality of connection pads and the plurality of first bonding pads may be respectively connected to one another via a corresponding wire. However, the present inventive concept is not limited thereto.

One surface of the second semiconductor chip 430 may be in contact with another surface of the first semiconductor chip 420. The second semiconductor chip 430 may include a plurality of second bonding pads. For example, the plurality of second bonding pads may be formed in the second semiconductor chip 430, and the second semiconductor chip 430 may be connected to a substrate or chip through the plurality of second bonding pads. For example, the second semiconductor chip 430 may be electrically connected to the first semiconductor chip 420 through the plurality of second bonding pads. However, the present inventive concept is not limited thereto.

The second semiconductor chip 430 may be connected to the package board 410. In this case, the second semiconductor chip 430 may be connected to the plurality of connection pads formed on the package board 410 through the plurality of second bonding pads. In an example embodiment of the present inventive concept, the plurality of connection pads and the plurality of second bonding pads may be respectively connected to one another via a corresponding wire.

The second semiconductor chip 430 may be connected to the first semiconductor chip 420. In this case, the second semiconductor chip 430 may be connected to the plurality of first bonding pads formed in the first semiconductor chip 420 through the plurality of second bonding pads of the second semiconductor chip 430. In an example embodiment of the present inventive concept, the plurality of first bonding pads and the plurality of second bonding pads may be respectively connected to one another through a corresponding wire.

The thermal fuse circuit 440 may be arranged on another surface of the second semiconductor chip 430. For example, one surface of the thermal fuse circuit 440 may be in contact with another surface of the second semiconductor chip 430.

In this case, the thermal fuse circuit 440 may be arranged on another surface of the second semiconductor chip 430 to be located in the central region of the package board 410.

The thermal fuse circuit 440 may be connected between a sensing connection pad 411 of the plurality of connection pads and a sensing bonding pad 431 of the plurality of bonding pads. In this case, the second sensing bonding pad 431 may be connected to a first sensing bonding pad 421 of the plurality of first bonding pads.

In this case, the sensing connection pad 411 may be one of the plurality of connection pads to which signals used in the internal operation of the first semiconductor chip 420 or the second semiconductor chip 430 are transmitted. In this case, the first sensing connection pad 421 may be one of the plurality of first bonding pads to which signals used in the internal operation of the first semiconductor chip 420 or the second semiconductor chip 430 are transmitted. The second sensing connection pad 431 may be one of the plurality of second bonding pads to which signals used in the internal operation of the first semiconductor chip 420 or the second semiconductor chip 430 are transmitted.

When the internal temperature of the thermal fuse circuit is greater than or equal to the cutoff temperature of the thermal fuse circuit 440, the thermal fuse circuit 440 may open between the sensing connection pad 411 and the second sensing bonding pad 431. For example, when the internal temperature of the thermal fuse circuit 130 is greater than or equal to the cutoff temperature of the thermal fuse circuit 440, the thermal fuse circuit 130 may cut off a connection between the package board 410 and the second semiconductor chip 430.

The circuit board 500 may be connected to the package board 410. For example, the package board 410 may be mounted on the circuit board 500 so that a surface of the package board 410 may be in contact with one surface of the circuit board 500.

In summary, the circuit board 500 may be connected to the package board 410, and one surface of the package board 410 may be in contact with one surface of the first semiconductor chip 420. Another surface of the first semiconductor chip 420 may be in contact with one surface of the second semiconductor chip 430, and another surface of the second semiconductor chip 430 may be in contact with one surface of the thermal fuse circuit 440. For example, in the memory device 40, of the solder balls 600, the package board 410, the first semiconductor chip 420, and the second semiconductor chip 430, the thermal fuse circuit 440 may be disposed to be farthest from the circuit board 500.

In this case, when the semiconductor package 400 is separated from the circuit board 500 by melting the plurality of solder balls 600 to access to data stored in the semiconductor package 400 without permission (e.g., unauthorized access), the semiconductor package 400 arranged on the circuit board 500 may be directly heated. For example, the semiconductor package 400 may be heated in an upward direction with reference to FIG. 8. In this case, the semiconductor package 400 may be heated in a direction adjacent to the thermal fuse circuit 440 and in a direction distant from the plurality of solder balls 600. Thus, when the memory device 40 is heated so as to gain access to data stored in the semiconductor package 400 without permission, the temperature of the thermal fuse circuit 440 may be greater than the temperature of the plurality of solder balls 600. Thus, even if the cutoff temperature is greater than the reflow process temperature by the first margin temperature, when the semiconductor package 400 is separated from the circuit board 500 without permission, unauthorized access to the data stored in the semiconductor package 400 may be prevented through the thermal fuse circuit 440 because the cutoff temperature would have already been reached and the thermal fuse circuit 440 would have been disconnected.

Figure 9:
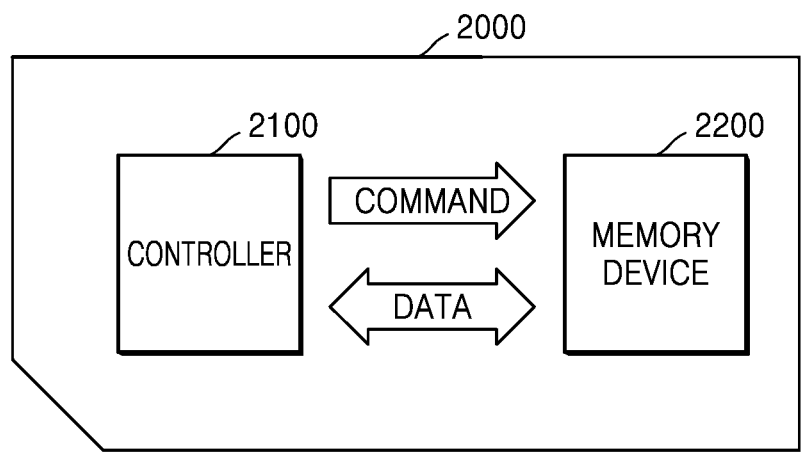
FIG. 9 is a view illustrating a memory system according to an example embodiment of the present inventive concept.

FIG. 9 is a view illustrating a memory system according to an example embodiment of the present inventive concept.

Referring to FIG. 9, a memory system 2000 according to an example embodiment of the present inventive concept may include a controller 2100 and a memory device 2200. In this case, the controller 2100 and the memory device 2200 may be disposed to exchange electrical signals between each other. For example, when a command is issued from the controller 2100 to the memory device 2200, the memory device 2200 may transmit data to the controller 2100 in response to the received command. The memory device 2200 may be a memory device according to an example embodiment of the present inventive concept.

Figure 10:
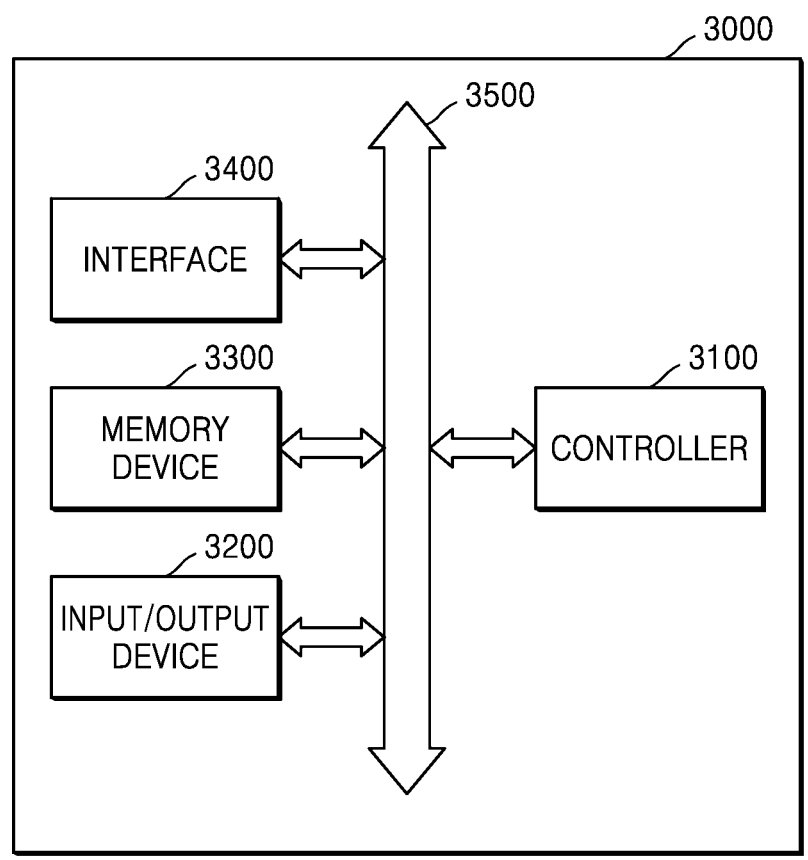
FIG. 10 is a view illustrating an electronic device including a memory device according to an example embodiment of the present inventive concept.

FIG. 10 is a view illustrating an electronic device including a memory device according to an example embodiment of the present inventive concept.

Referring to FIG. 10, an electronic device 3000 may include a controller 3100, an input/output device 3200, a memory device 3300, and an interface 3400. For example, the electronic device 3000 may be a device that transmits or receives information in a wireless manner. The electronic device 3000 may be, for example, a personal digital assistants (PDA), a portable computer, a web tablet, a wireless phone, a mobile phone, a digital music player, or a memory card. The controller 3100 may execute a program and control the electronic device 3000. The controller 3100 may be, for example, a microprocessor, a digital signal processor, a microcontroller, or a similar device.

The input/output device 3200 may be used to input or output data of the electronic device 3000. The electronic device 3000 may be connected to an external device, for example, a personal computer (PC) or a network by using the input/output device 3200 and may exchange data with an external device. The input/output device 3200 may be, for example, a keypad, a keyboard or a display device.

The memory device 3300 may store a code and/or data for the operation of the controller 3100 or may store data processed by the controller 3100. The memory device 3300 may be a memory device according to an example embodiment of the present inventive concept.

The interface 3400 may be a data transmission path between the electronic device 3000 and another external device.

The controller 3100, the input/output device 3200, the memory device 3300, and the interface 3400 may communicate with one another through a bus 3500.

In a semiconductor package and a memory device including the same according to an example embodiment of the present inventive concept as described above, when the internal temperature is greater than or equal to a cutoff temperature, a thermal fuse circuit for opening between a sensing connection pad and a sensing bonding pad may be used so that when heat is applied to the semiconductor package to melt a plurality of solder balls, unauthorized access to data stored in the semiconductor package can be prevented.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package comprising:
a package board including a plurality of connection pads;
a semiconductor chip including a first surface and a plurality of bonding pads, wherein the first surface of the semiconductor chip contacts a first surface of the package board, and wherein the plurality of bonding pads are respectively connected to the plurality of connection pads; and
a thermal fuse circuit connected between a sensing connection pad of the plurality of connection pads and a sensing bonding pad of the plurality of bonding pads, and configured to open between the sensing connection pad and the sensing bonding pad when an internal temperature of the thermal fuse circuit is greater than or equal to a cutoff temperature of the thermal fuse circuit.

2. The semiconductor package of claim 1, wherein the thermal fuse circuit is arranged on a second surface of the semiconductor chip.

3. The semiconductor package of claim 2, wherein the thermal fuse circuit is arranged on the second surface of the semiconductor chip such that it is located in a central region of the package board.

4. The semiconductor package of claim 1, wherein the sensing connection pad is one of the plurality of connection pads to which signals used in an internal operation of the semiconductor chip are transmitted, and the sensing bonding pad is one of the plurality of bonding pads to which signals used in the internal operation of the semiconductor chip are transmitted.

5. The semiconductor package of claim 4, wherein the internal operation comprises a read operation of transmitting data stored in the semiconductor chip, and signals used in the read operation comprise a chip enable signal, a read enable signal, a data strobe signal, a data signal, and a power signal.

6. The semiconductor package of claim 1, wherein the cutoff temperature is greater than a temperature obtained by adding a first margin temperature to a reflow process temperature.

7. The semiconductor package of claim 6, wherein the cutoff temperature is less than a temperature obtained by adding a second margin temperature to the reflow process temperature, and the second margin temperature is greater than the first margin temperature.

8. The semiconductor package of claim 1, wherein the thermal fuse circuit comprises:
a first thermal fuse having a first end connected to the sensing connection pad;
a second thermal fuse having a first end connected to the sensing connection pad; and
an AND gate having a first input terminal, a second input terminal, and an output terminal, wherein the first input terminal is connected to a second end of the first thermal fuse, wherein the second input terminal is connected to a second end of the second thermal fuse, and wherein the output terminal is connected to the sensing bonding pad.

9. The semiconductor package of claim 1, wherein the thermal fuse circuit comprises:
a third thermal fuse having a first end connected to the sensing connection pad; and
a fourth thermal fuse having a first end and a second end, wherein the first end of the fourth thermal fuse is connected to a second end of the third thermal fuse, and the second end of the fourth thermal fuse is connected to the sensing bonding pad.

10. The semiconductor package of claim 1, wherein, when the internal temperature is greater than or equal to the cutoff temperature regardless of a supply of power, the thermal fuse circuit opens between the sensing connection pad and the sensing bonding pad.

11. The semiconductor package of claim 1, wherein the plurality of connection pads and the plurality of bonding pads are respectively connected to one another through a corresponding wire.

12. A semiconductor package comprising:
a package board including a plurality of connection pads;
a first semiconductor chip including a first surface and a plurality of first bonding pads, wherein the first surface of the first semiconductor chip is in contact with a first surface of the package board;
a second semiconductor chip including a first surface and a plurality of second bonding pads, wherein the first surface of the second semiconductor chip is in contact with a second surface of the first semiconductor chip, and wherein the plurality of second bonding pads are connected to the plurality of connection pads and the plurality of first bonding pads; and
a thermal fuse circuit connected between a sensing connection pad of the plurality of connection pads and a second sensing bonding pad of the plurality of second bonding pads, and configured to open between the sensing connection pad and the second sensing bonding pad when an internal temperature of the thermal fuse circuit is greater than or equal to a cutoff temperature of the thermal fuse circuit.

13. The semiconductor package of claim 12, wherein the thermal fuse circuit is arranged on a second surface of the second semiconductor chip such that it is located in a central region of the package board.

14. The semiconductor package of claim 12, wherein the second sensing bonding pad is connected to a first sensing bonding pad of the plurality of first bonding pads.

15. The semiconductor package of claim 14, wherein the sensing connection pad is one of the plurality of connection pads to which signals used in an internal operation of the first semiconductor chip or the second semiconductor chip are transmitted, wherein the first sensing bonding pad is one of the plurality of first bonding pads to which signals used in an internal operation of the first semiconductor chip or the second semiconductor chip are transmitted, and wherein the second sensing bonding pad is one of the plurality of second bonding pads to which signals used in an internal operation of the first semiconductor chip or the second semiconductor chip are transmitted.

16. The semiconductor package of claim 12, wherein the plurality of connection pads and the plurality of first bonding pads are respectively connected to one another through a corresponding wire, and the plurality of first bonding pads and the plurality of second bonding pads are respectively connected to one another through a corresponding wire.

17. A memory device comprising:
a circuit board comprising a plurality of connection pins;
a package board including a plurality of connection pads to be connected to the plurality of connection pins through a plurality of solder balls;
a semiconductor chip including a first surface and a plurality of bonding pads, wherein the first surface of the semiconductor chip is in contact with a first surface of the package board, and wherein the plurality of bonding pads are connected to the plurality of connection pads; and
a thermal fuse circuit connected to a sensing connection pad of the plurality of connection pads and a sensing bonding pad of the plurality of bonding pads, and configured to open between the sensing connection pad and the sensing bonding pad when an internal temperature of the thermal fuse circuit is greater than or equal to a cutoff temperature of the thermal fuse circuit.

18. The memory device of claim 17, wherein the sensing connection pad is connected to a sensing connection pin of the plurality of connection pins, wherein the sensing connection pin is one of the plurality of connection pins to which signals used in an internal operation of the semiconductor chip are transmitted, wherein the sensing connection pad is one of the plurality of connection pads to which signals used in an internal operation of the semiconductor chip are transmitted, and wherein the sensing bonding pad is one of the plurality of bonding pads to which signals used in the internal operation of the semiconductor chip are transmitted.

19. The memory device of claim 17, wherein the cutoff temperature is set in consideration of a reflow process temperature, and the reflow process temperature is set in consideration of a melting point of the plurality of solder balls.

20. The memory device of claim 19, wherein the cutoff temperature is greater than a temperature obtained by adding a first margin temperature to the reflow process temperature and is less than temperature obtained by adding a second margin temperature to the reflow process temperature, and wherein the second margin temperature is greater than the first margin temperature.

* * * * *